US006677809B2

(12) United States Patent
Perque et al.

(10) Patent No.: US 6,677,809 B2
(45) Date of Patent: Jan. 13, 2004

(54) INTEGRATION OF A VOLTAGE REGULATOR

(75) Inventors: Vincent Perque, Saint Martin D'Heres (FR); Juliette Weiss, Crolles (FR); Guy Mabboux, Chapareillan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/886,967

(22) Filed: Jun. 21, 2001

(65) Prior Publication Data

US 2002/0014914 A1 Feb. 7, 2002

(30) Foreign Application Priority Data

Jun. 28, 2000 (FR) .......................................... 00 08315

(51) Int. Cl.[7] ........................... G05F 1/56; H01L 23/50

(52) U.S. Cl. ....................... 327/541; 327/566; 323/269; 307/18

(58) Field of Search ................................ 327/108, 540, 327/541, 543, 564, 565, 566; 323/272, 269; 363/147; 307/18

(56) References Cited

U.S. PATENT DOCUMENTS 5,132,555 A * 7/1992 Takahashi .................. 327/540
5,408,172 A 4/1995 Tanimoto et al.
5,508,653 A 4/1996 Chu et al.
5,635,822 A * 6/1997 Marchió et al. ............ 323/273
5,739,681 A * 4/1998 Allman ....................... 323/314
5,747,974 A 5/1998 Jeon
5,883,537 A * 3/1999 Luoni et al. ................ 327/318
5,936,388 A 8/1999 Casper
5,994,950 A 11/1999 Ochi
6,114,843 A * 9/2000 Olah .......................... 323/280

OTHER PUBLICATIONS

Ito et al., United States patent application Publication US 2001/0054760 A1, "Semiconductor Integrated Circuit", filed Jun. 6, 2001.*

Ooishi T. et al. "A Mixed–Mode Voltage Down Converter With Impedance Adjustment Circuitry for Low–Voltage High–Frequency Memories" IEEE Journal of Solid–State Circuits, US, IEEE Inc., New York, vol. 31, No. 4, Apr. 1, 1996, pp. 575–584.

* cited by examiner

*Primary Examiner*—Timothy P. Callahan
*Assistant Examiner*—Terry L. Englund
(74) *Attorney, Agent, or Firm*—Wolf, Greenfield & Sacks, P.C.; James H. Morris

(57) ABSTRACT

An integrated circuit with a D.C./D.C. internal voltage regulator, including at least two power stages of the regulator, having respective terminals of connection to a supply voltage connected to distinct pads of the integrated circuit, and a single control stage.

19 Claims, 2 Drawing Sheets

INTEGRATION OF A VOLTAGE REGULATOR

BACKGROUND OF THE INVENTION

1. Field of the Invention

The present invention relates to supplying power to integrated circuits and, more specifically, to the integration of a voltage regulator into the circuit to be supplied voltage. The present invention more specifically relates to linear D.C./D.C. regulators. Such regulators essentially include a control stage and a power stage. The power stage is, most often, formed of a MOS transistor having one power terminal (drain or source) connected to a D.C. supply voltage and the other power terminal (source or drain) providing the regulated voltage. The control gate or terminal of the power transistor is connected to the output of the regulator control stage. This control stage essentially includes a comparator that compares a voltage representative of the regulated output voltage with a reference voltage. This reference voltage is most often provided by a commonly-called band-gap circuit. The operating principle of a series D.C./D.C. regulator is well known in the art. In the present description a power transistor does not refer to a high voltage transistor but to the fact that the power stage must conduct a relatively high supply current (generally ranging between a few tens of milliamperes and approximately one ampere).

2. Discussion of the Related Art

The use of a D.C./D.C. regulator in an integrated circuit is linked to the presence of a supply voltage available on the board where the integrated circuit is implanted, which is greater than the supply voltage of the components internal to the circuit.

An example of application of the present invention is the replacing of an integrated circuit on a printed circuit board with the least possible modifications. For example, technological progress has led to an increasingly advanced miniaturization of integrated circuits, which goes along with a decrease in their supply voltage. To keep on using a given electronic board, designed with a technology designed to use a first supply voltage (for example, 5 V) with an integrated circuit in a more recent technology that uses a lower voltage (for example, 3.3 volts), it is necessary to lower the circuit supply voltage. For this purpose, a first solution is to modify the printed circuit board. However, such a modification is not desirable.

A second solution to which the present invention applies includes integrating a voltage regulator into the integrated circuit. This regulator then has the function of converting the supply voltage present on the board into a supply voltage acceptable for the integrated circuit according to the technology used.

FIG. 1 very schematically shows the structure of a conventional integrated circuit 1 provided with a voltage regulator 2 (REG). Such a circuit 1 is generally essentially formed of a core 3 (C) integrating the different functions associated with the actual application of integrated circuit 1, of input/output circuits (block 4), and of regulator 2. The function of input/output block 4 is to be used as an interface between the integrated circuit core and the outside. It may be, for example, an adaptation of voltage levels between the inside and the outside, electrostatic protection devices and, more generally, electronic circuits (most often, amplifiers) enabling exchange between the inside and the outside of the circuit. Input/output block(s) 4 most often receive the supply voltage HVDD of circuit 1 drawn from the printed circuit board (not shown) through a terminal 8 and a voltage VDD (most often smaller, due to the technology used) corresponding to the operating voltage of core 3 of the integrated circuit. Ground GND of the integrated circuit core and of the input/output block is common. Voltage VDD is provided by regulator 2, which receives voltage HVDD. Core 3 of the integrated circuit communicates with input/output blocks 4 via electronic connections 5. Input/output blocks 4 communicate with the outside of the circuit via connections 6 to terminals 7 of the integrated circuit. In practice, input/output blocks 4 of the integrated circuit are formed in what is called a crown of the circuit. This crown surrounds core 3 of the circuit containing the actual application.

A conventional example of an integrated circuit, of the type described hereabove, is described in an article entitled "Embedded 5 V-to-3.3 V Voltage Regulator for Supplying Digital IC's in 3.3 V CMOS Technology" by Gerrit W.den Besten and Bram Nauta, published in the IEEE Journal of Solid-State Circuits, volume 33, n°7, July 1998 which is incorporated herein by reference.

However, the advantages of having an integrated circuit included on a printed circuit board that provides a greater power supply do not outweigh the disadvantages of known integrated-regulator solutions.

A first disadvantage is that there is a series voltage drop due to the lines conveying voltage VDD. Indeed, regulator 2 must provide the power supply for the entire integrated circuit core. In integrated circuits requiring no regulator, that is, able to receive a supply voltage directly from the outside of the circuit, the terminals of application of the supply voltage are generally multiplied to avoid this phenomenon. The voltage drop linked to the line conveying the supply voltage requires adapting the power stage of the regulator to each application, and thus the transistor forming it.

A second disadvantage is that the routing of the wide supply lines in an integrated circuit, based on a single point, is poorly adapted to forming complex integrated circuits using automatic placing and routing tools.

A third disadvantage is that the use of a single pad of terminal 8 for connection to external supply voltage HVDD causes irregular power dissipation in the integrated circuit. Indeed, the higher the power to be provided by the regulator, the more the regulator dissipates. This power dissipation is essentially due to the ballast transistor of its power stage and is thus localized. This results in an undesirable temperature gradient in the integrated circuit. It could be devised to multiply the number of regulators in the integrated circuit to decrease the individual power dissipated by each one of them. Such a solution would bring about several other disadvantages, among which:

- a bulk increase of the regulator, and thus of the integrated circuit; and
- a problem of distribution of the supply voltages in the integrated circuit. Indeed, a metal level of a multiple-layer integrated circuit is generally used to form a supply distribution grid (routing grid). By multiplying the number of regulators, it is then necessary to divide this grid up. There again, a solution that must be adapted to each case, and thus to each application, is obtained.

Another disadvantage of the existence of a single supply pad outside the package is that this creates significant parasitic inductances on the regulator supply line. Indeed, the higher the number of supply terminals, the more the parasitic inductances due to the connection between the chip and the outside of the package are divided (by being associated in parallel).

It would be desirable to have a linear D.C./D.C. regulator that is versatile by being able to easily adapt to different integrated circuit chips. In particular, the current design of integrated circuit chips uses a library of circuits or individual components that are assembled to implement the desired function. In this regard, the fact of having to adapt the regulator, and especially the sizing of its power stage, to each application negates the beneficial effects of a circuit integrating a voltage regulator.

SUMMARY OF THE INVENTION

An object of the present invention is to overcome the disadvantages of known circuits integrating a voltage regulator.

The present invention more specifically aims at providing a novel integrated circuit with an internal voltage regulator that allows use of several terminals for connection to an external supply voltage.

An object of the present invention also is that the internal regulator can provide several connections on the metal level of internal distribution of the integrated circuit supply voltage (routing grid).

The present invention also aims at improving the temperature uniformity in an integrated circuit with an internal regulator.

The present invention also aims at providing a solution that is versatile, that is, that can be transposed to different integrated circuits by simple association of identical elementary cells based on a library of a small number of cells.

The present invention further aims at providing a low-bulk solution.

To achieve these and other objects, the present invention provides an integrated circuit with a D.C./D.C. internal voltage regulator, including at least two power stages of the regulator, having respective terminals for connection to a supply voltage connected to distinct pads of the integrated circuit, and a single control stage.

According to an embodiment of the present invention, the power stages are arranged in an input/output crown of an integrated circuit chip, external to a core of this chip in which is formed, among others and at least partly, the control stage.

According to an embodiment of the present invention, the control stage includes means for generating a reference voltage and a means for comparing a voltage representative of the regulated voltage with this reference voltage, integrated in the core of the chip, and a stage for measuring the regulated voltage, integrated in the chip crown.

According to an embodiment of the present invention, the circuit includes a single power stage, dedicated to the control stage and providing thereto its specific supply voltage.

According to an embodiment of the present invention, each power stage includes a MOS transistor, a first power terminal of which is connected to a pad of the integrated circuit, a second power terminal of which is connected to a terminal of supply of the chip core, the gate of the power transistor being connected to an output of the control stage.

According to an embodiment of the present invention, a filtering means is associated with each power stage.

The present invention also provides a method for integrating a linear regulator into an integrated circuit chip, including integrating a control part into the chip core and at least two power stages into the input/output crown of this chip.

According to an embodiment of the present invention, the number of power stages depends on the power consumption of the chip core.

The foregoing objects, features and advantages of the present invention will be discussed in detail in the following non-limiting description of specific embodiments in connection with the accompanying drawings.

DETAILED DESCRIPTION

Figure 1:
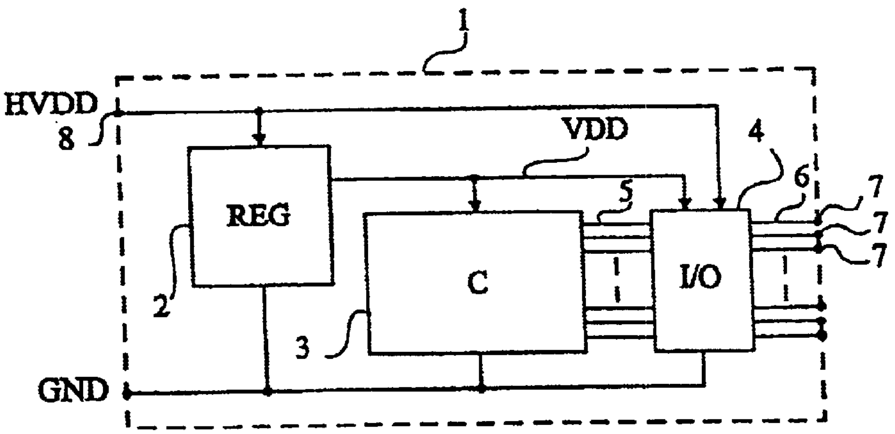
FIG. 1 (PRIOR ART)
FIG. 1, previously described, shows a conventional example of a circuit integrating a voltage regulator.

The same elements have been designated with the same references in the different drawings. For clarity, only those elements of the regulator and of the integrated circuit that are necessary to the understanding of the present invention have been shown in the drawings and will be described hereafter. In particular, the internal components of the control stage of a regulator according to the present invention have not been detailed, since they are perfectly well known.

A feature of the present invention is to separate the control and power portions of the linear regulator. In other words, the present invention provides for dissociating the respective integrations of the control stage of the linear regulator and of its power stage.

Another feature of the present invention is to provide several power stages. More specifically, in an integrated circuit in MOS technology, several distinct MOS transistors are provided, each of them being connected by one of its power electrodes to a terminal of application of a supply voltage external to the integrated circuit and by the other one of its power terminals to the metal level of distribution of the internal supply voltage. According to the present invention, all these MOS transistors are controlled by a single control stage.

As compared to the use of several complete voltage regulators arranged in parallel, this has, among others, the advantage of balancing the output supply voltage.

According to the present invention, the number of power elements or stages depends on the power consumption of the circuit (which essentially depends on the chip size and operating frequency) as well as on the bulk of the power stages.

Figure 2:
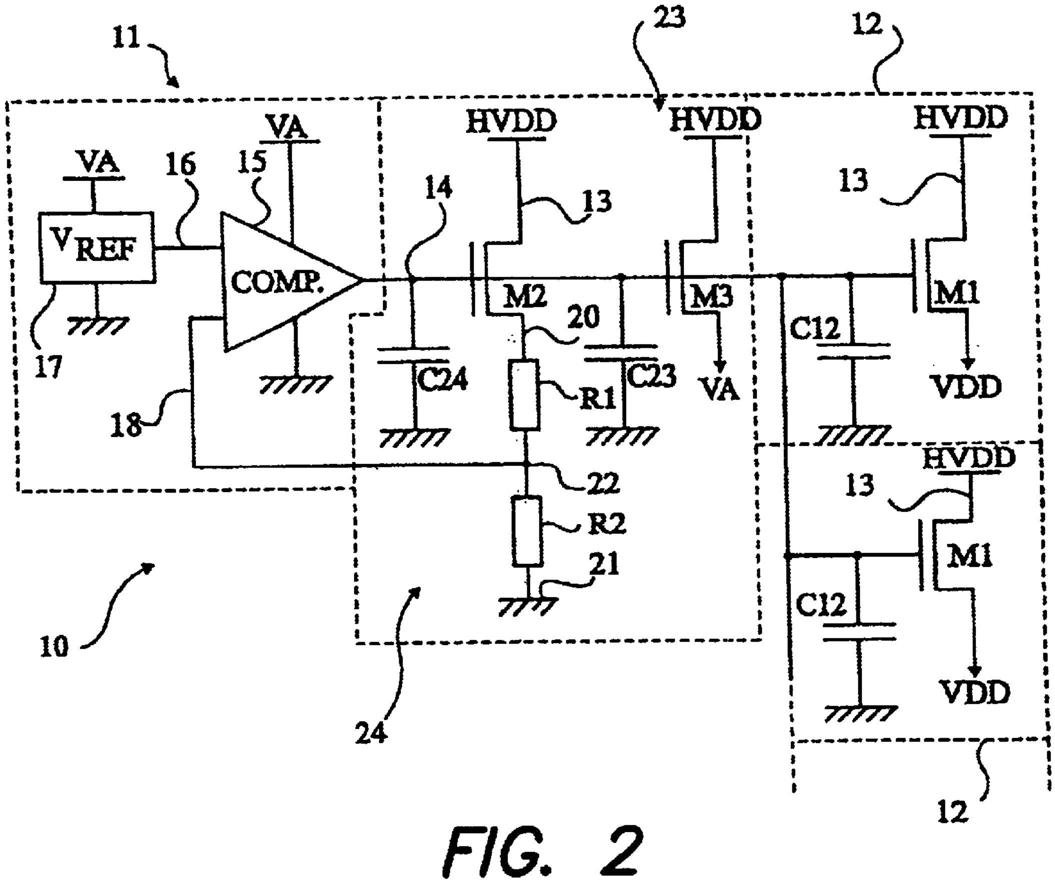
FIG. 2 shows a D.C./D.C. voltage regulator according to an embodiment of the present invention.

FIG. 2 shows the electric diagram of a preferred embodiment of a voltage regulator according to the present invention, intended for being integrated with the components that it must supply.

Regulator 10 includes a single control stage 11 and several power stages or elements 12. Power stages 12 are, preferably, all identical, but may, of course, as an alternative, be sized to provide different currents. Each power stage 12 includes a MOS transistor M1, a first power terminal of which (for example, drain 13) is connected to a terminal of the integrated circuit receiving voltage HVDD. The other power terminal of each transistor M1 is individually connected to the metal level of distribution of voltage VDD of supply of the integrated circuit core (not shown in FIG. 2). The respective gates of transistors M1 are connected together to an output terminal 14 of control stage 11 of the regulator. An important feature of the present invention is that the connection of each power stage to supply voltage HVDD, external to the integrated circuit, is performed by a pad separated by each of these stages. The integrated circuit thus includes as many terminals of application of voltage HVDD drawn from the board as its regulator includes power stages.

Control stage 11 essentially includes a comparator 15 receiving, on a first input 16, a reference voltage VREF provided by an appropriate circuit 17 (for example, a circuit of generation of a reference voltage of BANDGAP type). A second input 18 of comparator 15 receives a voltage representative of output voltage VDD provided by the regulator.

In regulators of the type to which the present invention applies, the output voltage regulation is performed without taking account of the instantaneous power consumption of the integrated circuit. In the preferred embodiment of the present invention, a dedicated measurement stage 24 is used. This stage essentially includes a MOS transistor M2. A first power electrode (for example, drain 13) of transistor M2 is connected to voltage HVDD by a dedicated terminal of the integrated circuit. The other power electrode 20 of transistor M2 is connected to ground 21 via a resistive dividing bridge (R1–R2). The gate of transistor M2 is connected to output 14 of comparator 15. The midpoint 22 of the series connection of resistors R1 and R2 is connected to terminal 18 of comparator 15.

The use of a dedicated measurement stage to measure the regulated voltage is preferred to an extraction of this voltage from one of the terminals of power stages 12.

Indeed, this makes the voltage representative of the regulated voltage (measured by transistor M2) independent from the regulator power consumption. Accordingly, in this preferred embodiment of the present invention, the number of power stages 12 is chosen according to the maximum expected power consumption for the integrated circuit and there is no risk of the regulator being unable to provide the desired current. The use of a dedicated transistor M2 for the regulator further enables avoiding having to take account of the circuit core (which is variable from one application to another) in the setting of the stability of the comparator feedback.

Comparator 15 and reference circuit 17 of control stage 11 can be supplied by voltage VDD then drawn from the distribution metal level of the integrated circuit. However, in a preferred embodiment such as illustrated in FIG. 2, these components of the control stage receive a supply voltage VA provided by a dedicated supply stage 23. This supply stage is formed, like stages 12, of a MOS transistor, here M3, a first power electrode of which is connected to voltage HVDD and a second power electrode of which provides voltage VA, the gate of this transistor being connected to terminal 14. The use of a dedicated transistor M3 for the supply of comparator 15 and of circuit 17 makes the supply of the voltage reference circuit independent from the integrated circuit power consumption.

Preferably, the gate of each transistor M1, M2, or M3 is associated with a capacitor, respectively C12, C24 or C23 performing the function of a filtering element to smooth the regulation. One capacitor per transistor is preferably used, rather than a common capacitor at the output of comparator 15. This improves the versatility of the regulator according to the present invention. Indeed, since each filtering capacitor depends on the size of the associated power transistor, using a capacitor shared by several power stages would lead to having to size this capacitor according to the number of these stages.

Another feature of the present invention is to provide specific arrangement of the power stages and of the control stage of the regulator in the integrated circuit. Thus, according to the present invention, the power stages are distributed in the integrated circuit crown, that is, in the portion thereof intended for input/outputs. Advantage is taken from the fact that supply voltage HVDD as well as internal supply voltage VDD generally are present in this region of the integrated circuit. Accordingly, all the voltage levels necessary to the operation of power stages 12 are present therein. Control stage 11, more specifically the components of this control stage except for measurement stage 24, are integrated into the integrated circuit core. This is perfectly compatible with the fact that these different elements only use a supply voltage compatible with the integrated circuit technology.

Figure 3:
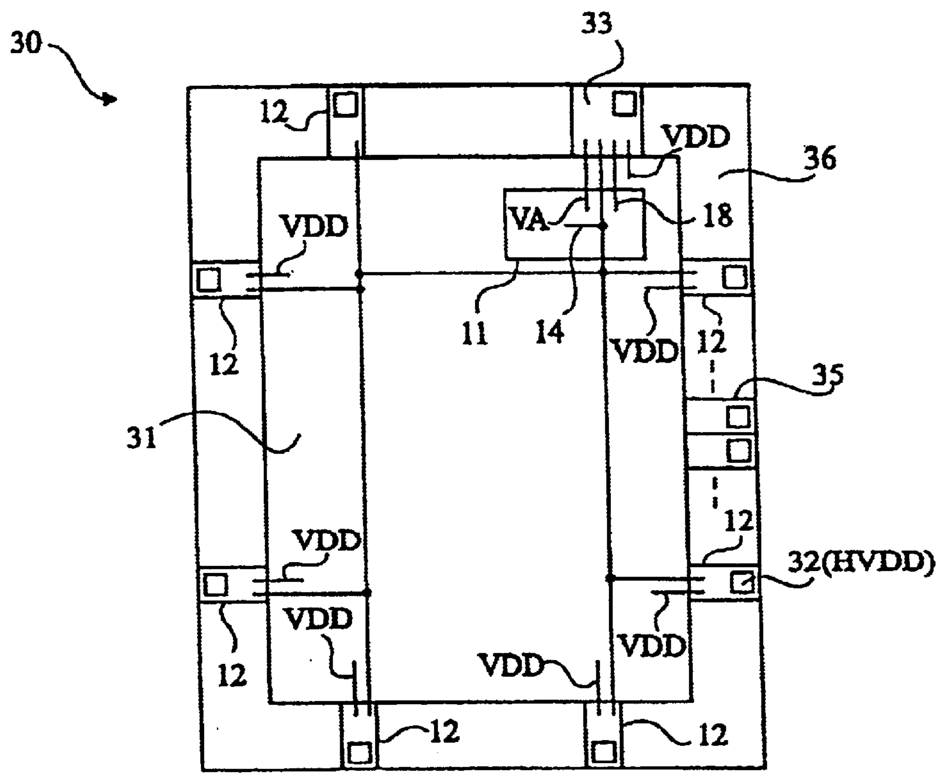
FIG. 3 very schematically illustrates an embodiment of the method of the present invention of integration of a voltage regulator into an integrated circuit.

FIG. 3 illustrates, by a simplified top view of an integrated circuit chip 30, an embodiment of this feature of the method of the present invention. The different portions integrated into chip 30 are shown therein by blocks. Core 31 of the chip, performing the functions for which this chip is provided, integrates control stage 11 of the regulator. Output 14 of the comparator of this regulator is connected to several power stages 12 distributed in crown 36 of chip 30, that is, at the periphery of core 31. Each stage 12 is individually connected to a terminal 32 intended to be connected to a track that provides voltage HVDD to the printed circuit board (not shown) on which the integrated circuit is assembled. Each power stage 12 is, on the side of core 31, connected to the grid of distribution of supply voltage VDD (not shown in detail).

Preferably, close to control stage 11 in core 31, a specific power element or stage 33 preferably integrating measurement stage 24 and supply stage 23 dedicated to comparator 15 and to reference circuit 17 is provided. This specific power stage 33 is also connected inside the package to voltage HVDD. On the side of core 31, stage 33 includes a connection to output 14 of the comparator, a connection to input 18 of the comparator, a connection to voltage VA, and possibly an additional connection to voltage VDD. In this latter case, stage 33 further includes a power element similar to element 12 of the other stages.

This arrangement of the three transistors in the same element 33 enables good matching of the transistors together, allowing precise measurement of the regulated voltage.

Conventionally, other input/output elements 35 are distributed in crown 36 at the periphery of core 31 of chip 30.

Figure 4:
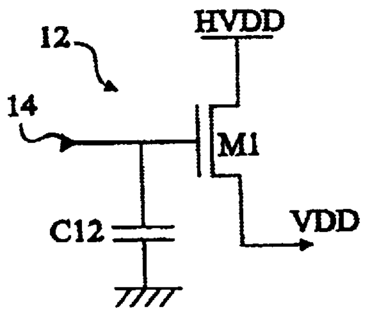
FIG. 4 shows the electric diagram of a preferred embodiment of a cell forming a power stage of a regulator according to the present invention.

FIG. 4 shows the equivalent electric diagram of a preferred embodiment of a cell integrating a power stage 12. This drawing should be compared with the representation of FIG. 2 and defines an individual element of an integrated circuit design aid library. Such an element or cell is exclusively formed of transistor M1 and of a capacitor C12. This element includes four terminals of connection, respectively, to voltage HVDD, to voltage VDD, to ground, and to terminal 14 of the comparator of the regulator control stage.

Figure 5:
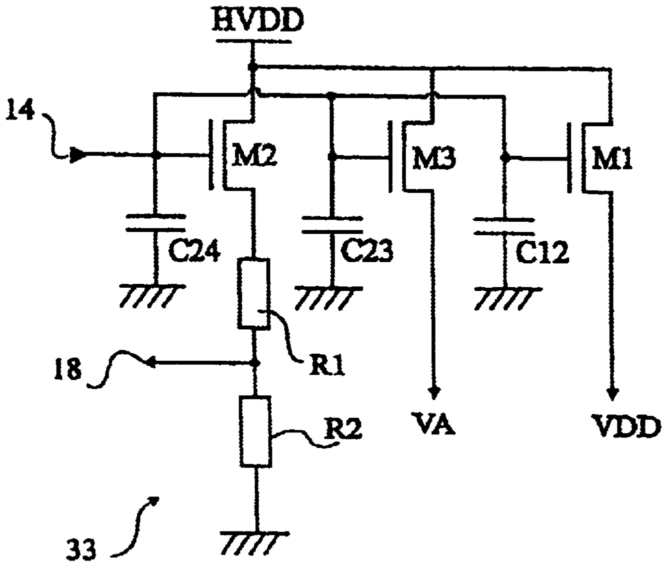
FIG. 5 shows a preferred embodiment of a cell forming a power and measurement stage of a regulator according to the present invention.

FIG. 5 shows a preferred embodiment of a cell dedicated to the control stage of a regulator according to the present invention. Cell 33 includes three transistors M1, M2, and M3 individually associated with respective capacitors C12, C23, and C24. The assemblies of transistors M1, M2, and M3 respectively define power stage 12, measurement stage 24, and supply stage 23 such as described in relation with FIG. 2. Accordingly, a cell 33 such as illustrated in FIG. 5 includes five terminals of access, respectively, to voltage HVDD, to voltage VDD, to supply voltage VA of the regulator control stage and to terminals 14 and 18 of this control stage.

In an integrated circuit of the present invention, a single cell 33, as many cells 12 as necessary according to the power required by the integrated circuit, and a single control stage 11 (comparator 15 and reference 17) are used.

Thus, using three elementary subsets, a voltage regulator adaptable to any integrated circuit size or power can be formed. The greater the size of the integrated circuit, the more it generally requires a significant supply current and the more it has terminals available for connection to the supply voltage of the printed circuit on which it is assembled.

It may also be provided, according to the supply voltage of the technology used in the circuit core, to divide up capacitors C12, C23, and C24 by connecting several capacitors in series.

An advantage of the present invention is that it enables forming a regulator, integrated to a circuit, which is perfectly versatile and adaptable to different types of integrated circuit.

Another advantage of the present invention is that it solves the problems associated with the number of terminals of connection to the supply voltage external to the circuit. Thus, the implementation of the present invention enables reducing or minimizing the access resistance to the supply voltages as well as the parasitic inductances linked to the package connections.

Another advantage of the present invention is that it distributes the temperature dissipation in the integrated circuit surface.

Another advantage of the present invention is that it takes full advantage of the conventional distribution of an integrated circuit between an application core and an input/output crown.

Of course, the present invention is likely to have various alterations, modifications, and improvements which will readily occur to those skilled in the art. In particular, the sizing of the different regulator components is within the abilities of those skilled in the art according to the application and, especially, to the supply voltages, based on the functional indications given hereabove. Further, the present invention more specifically applies to an implementation in CMOS technology by exclusively using MOS transistors and a conventional control stage. Moreover, the forming of the control stage is within the abilities of those skilled in the art. For example, a control stage of the type of that described in the previously-mentioned article may be used. Finally, the present invention is equally applicable to a positive or negative voltage regulator. The sign of the voltage essentially conditions the type of channel of the power transistors and the electrode (source or drain) which is connected to the outside of the circuit.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit having a core and an input/output crown, the integrated circuit having a D.C./D.C. internal voltage regulator, including:

at least two power stages of the voltage regulator arranged in the input/output crown, external to the core, having respective terminals of connection to a supply voltage connected to distinct pads of the integrated circuit; and a control stage formed at least partly in the core of the integrated circuit and arranged to provide a control signal to each of the at least two power stages.

2. The circuit of claim 1, wherein the control stage includes:

means for generating a reference voltage;

means, connected to the means for generating the reference voltage and integrated in the core of the integrated circuit for comparing a voltage representative of a regulated voltage with the generated reference voltage; and a stage, integrated in the input/output crown, for measuring the regulated voltage.

3. The circuit of claim 1, including a power stage of the at least two power stages, dedicated to the control stage and providing thereto a second supply voltage specific to the control stage.

4. The circuit of claim 1, wherein each power stage of the at least two power stages includes a MOS transistor, a first power terminal of which is connected to a pad of the distinct pads of the integrated circuit, a second power terminal of which is connected to a terminal of supply of the core of the integrated circuit chip, the gate of the MOS transistor being connected to an output of the control stage.

5. The circuit of claim 4, wherein a respective filtering means is associated with each of the at least two power stages.

6. The circuit of claim 5, wherein each of the filtering means is a capacitor.

7. A method for integrating a linear regulator including a control part and at least two power stages into an integrated circuit chip, comprising:

integrating the control part into a core of the integrated circuit chip; and integrating the at least two power stages into an input/output crown of the integrated circuit chip, each of the power stages being arranged to receive a control signal from the control part.

8. The method of claim 7, wherein a number of the power stages depends on a power consumption of the core.

9. A voltage regulator, comprising:

a control stage disposed in a core of an integrated circuit;

a dedicated supply stage that receives an output of the control stage and provides a first voltage to the control stage;

a dedicated supply stage that receives an output of the control stage and provides a first voltage to the control stage;

a dedicated measurement stage that receives the output of the control stage and provides a second voltage to the control stage; and a power stage disposed in an input/output crown of the integrated circuit that receives the output of the control stage and provides a third voltage to an output of the voltage regulator.

10. The voltage regulator of claim 9, further comprising a second power stage that receives the output of the control stage and provides the third voltage to a second output of the voltage regulator.

11. The voltage regulator of claim 9, wherein the power stage comprises a MOS transistor having a control terminal coupled to the output of the control stage, a first terminal receiving a supply voltage, and a second terminal providing the third voltage.

12. The voltage regulator of claim 11, wherein the power stage further comprises a capacitor coupled to the control terminal of the MOS transistor.

13. The voltage regulator of claim 9, wherein the dedicated measurement stage comprises:

a MOS transistor having a control terminal coupled to the output of the control stage, a first terminal receiving a supply voltage, and a second terminal; and a resistive dividing bridge connected to the second terminal of the MOS transistor, the resistive dividing bridge having a midpoint connected to the control stage to provide the second voltage to the control stage.

14. The voltage regulator of claim 13, wherein the dedicated measurement stage further comprises a capacitor coupled to the control terminal of the MOS transistor.

15. The voltage regulator of claim 9, wherein the dedicated supply stage comprises a MOS transistor having a control terminal coupled to the output of the control stage, a first terminal receiving a supply voltage, and a second terminal providing the first voltage.

16. The voltage regulator of claim 15, wherein the dedicated supply stage further comprises a capacitor coupled to the control terminal of the MOS transistor.

17. The voltage regulator of claim 9, wherein die control stage comprises:

a comparator having an output terminal connected to the output of the control stage, a first supply terminal that receives the first voltage, a second supply terminal that is coupled to a reference potential, a first terminal that receives the second voltage, and a second terminal; and a circuit having a first terminal that receives the first voltage, a second terminal that provides a fourth voltage to the second terminal of the comparator, and a third terminal coupled to the reference potential.

18. The voltage regulator of claim 9, wherein the control stage is formed in the core of the integrated circuit chip, the dedicated supply stage is formed in crown of the integrated circuit chip, the dedicated measurement stage is formed in the crown of the integrated circuit chip, and the power stage is formed in the crown of the integrated circuit chip.

19. The voltage regulator of claim 9, wherein the second voltage is representative of the third voltage.

* * * * *

UNITED STATES PATENT AND TRADEMARK OFFICE

CERTIFICATE OF CORRECTION

PATENT NO. : 6,677,809 B2
DATED : January 13, 2004
INVENTOR(S) : Vincent Perque, Juliette Weiss and Guy Mabboux It is certified that error appears in the above-identified patent and that said Letters Patent is hereby corrected as shown below:

Column 8,
Lines 54-56, the following should be deleted: “a dedicated supply stage that receives an output of the control stage and provides a first voltage to the control stage”

Signed and Sealed this

Fourth Day of May, 2004

JON W. DUDAS
*Acting Director of the United States Patent and Trademark Office*